(12) United States Patent
Takami

(10) Patent No.: US 7,659,173 B2
(45) Date of Patent: Feb. 9, 2010

(54) METHOD FOR MANUFACTURING INSULATED-GATE TYPE FIELD EFFECT TRANSISTOR

(75) Inventor: Syuusei Takami, Kagoshima-ken (JP)

(73) Assignee: Yamaha Corporation, Shizuoka-ken (JP)

( * ) Notice: Subject to any disclaimer, the term of this patent is extended or adjusted under 35 U.S.C. 154(b) by 511 days.

(21) Appl. No.: 11/690,929

(22) Filed: Mar. 26, 2007

(65) Prior Publication Data
US 2007/0224764 A1    Sep. 27, 2007

(30) Foreign Application Priority Data
Mar. 27, 2006 (JP) .............................. 2006-084493
Aug. 4, 2006 (JP) .............................. 2006-213208

(51) Int. Cl.
*H01L 21/336* (2006.01)
(52) U.S. Cl. ................. 438/303; 438/549; 257/E21.206
(58) Field of Classification Search ................. 438/303, 438/549, 555, 556; 257/E21.206
See application file for complete search history.

(56) References Cited

U.S. PATENT DOCUMENTS

| 4,682,404 A | * | 7/1987 | Miller et al. ................. 438/306 |
| 5,710,054 A | * | 1/1998 | Gardner et al. .............. 438/304 |
| 6,723,609 B2 | * | 4/2004 | Yang et al. ................... 438/303 |

FOREIGN PATENT DOCUMENTS

JP    6-275635 A    9/1994

* cited by examiner

*Primary Examiner*—Chandra Chaudhari
(74) *Attorney, Agent, or Firm*—Dickstein Shapiro LLP

(57) ABSTRACT

A poly-silicon layer is deposited on a surface of a substrate after forming a gate insulating film in an element hole of a field insulating film 12, and thereon a silicon oxide layer is formed by a thermal oxidation process. After patterning the silicon oxide layer in accordance with a gate electrode pattern, the poly-silicon layer is patterned by dry-etching using a remaining resist layer as a mask. After removing the resist layer, a gate electrode layer 16a is formed by decreasing a width of the poly-silicon layer by isotropic etching using the silicon oxide layer 18A as a mask. $N^+$-type source and drain regions 22 and 24 and $n^-$-type source and drain regions 26 and 28 are formed by doping impurity ions via the gate insulating film 14 through the silicon oxide layer 18A. The silicon oxide layer 18A may be made of a layer of tungsten silicide.

3 Claims, 7 Drawing Sheets

METHOD FOR MANUFACTURING INSULATED-GATE TYPE FIELD EFFECT TRANSISTOR

CROSS REFERENCE TO RELATED APPLICATION

This application is based on Japanese Patent Application 2006-084493, filed on Mar. 27, 2006 and Japanese Patent Application 2006-213208, filed on Aug. 4, 2006, the entire contents of which are incorporated herein by reference.

BACKGROUND OF THE INVENTION

A) Field of the Invention

This invention relates to a method for manufacturing an insulated-gate type field effect transistor having an extension drain structure or the likes.

B) Description of the Related Art

An insulated-gate type field effect transistor having a lightly doped drain (LDD) structure is generally well known. The extension drain structure is basically similar to the LDD structure but the extension drain structure can avoid deterioration of performance caused by parasitic resistance by heightening an impurity concentration, in other words, it can restrain a short channel effect by doping ions at lower energy comparing to source and drain regions. Incidentally, a dose amount for the LDD region is about $5\times10^{13}$ cm$^{-2}$ at most, as dose amount for the extension drain region is about $1\times10^{14}$ to $1\times10^{15}$ cm$^{-2}$, and a dose amount four the source and drain regions is not less than about $1\times10^{15}$ cm$^{-2}$. It is said in common that the LDD structure has been taken over by the extension drain structure since a thickness of a gate electrode (wiring) became about 0.25 μm because the performance deterioration by parasitic resistance in the LDD part became unable to be overlooked.

Conventionally a method for manufacturing an insulated-gate type field effect transistor with the LDD structure as shown in FIG. 17 to FIG. 19 is known. The method is disclosed for example in Japanese Laid-open Patent No. H06-275635.

In a process shown in FIG. 17, after forming a field insulating film 2 having element hole 2a on one main surface of a p-type semiconductor substrate 1, a gate insulating film 3 made of silicon oxide or the like is formed on a semiconductor surface of in the element hole 2a. After depositing a poly-silicon layer on the insulating film 3, a gate electrode layer 4 composed of a remaining part of the poly-silicon layer by performing an etching process using a resist layer 5 as a mask. At this time, the gate insulating film 3 under the gate electrode layer 4 is remained whereas other part of the gate insulating film 3 is removed by the etching.

In a process shown in FIG. 18, with covering the gate electrode layer 4 by the resist layer 5, each side edge of the electrode layer 4 is retreated from a side edge of the resist layer for about a distance Δd=0.15 μm by a side etching process. As a result, for example, a width of the electrode layer 4 (a gate width) is reduced to 0.8 μm to 0.5 μm.

In a process shown in FIG. 19, after removing the resist layer 5, an n$^-$-type source region 8 and an n$^-$-type drain region 9 are formed respectively in p-type regions on source side and drain side of the electrode layer 4 by doping phosphorus ions with a mask consisting a lamination of the gate electrode layer 4 and the gate insulating film 3 and the field insulating film 2. The drain region 9 is usually called the LDD region.

An yield of the above-described conventional transistor is low, that is, the resist layer 5 is etched twice in the processes shown in FIG. 17 and FIG. 18 so that it is not easy to control the amount of side etching of the gate electrode layer 4, and amounts of the side etching vary widely. Therefore, gate widths vary widely. Moreover, in the ion doping process in FIG. 17, the ion doping is performed to the semiconductor surface exposed in the element hole 2a; therefore, the doping depths of the ions vary widely due to the so-called channeling phenomenon. By that, depths of n$^+$-type regions also vary widely.

In addition to that, a total of two ion doping processes is necessary in the source and drain formation process in FIG. 17 and the LDD formation process in FIG. 19; therefore, the number of processes is large, and low energy ion doping apparatus is necessary for the LDD formation process in FIG. 19.

SUMMARY OF THE INVENTION

It is an object of the present invention to provide a method for manufacturing an insulated-gate type field effect transistor having an extension drain structure or a lightly doped drain (LDD) structure with a small number of processes and a good yield.

According to one aspect of the present invention, there is provided a first method for manufacturing an insulated-gate type field effect transistor, comprising the steps of: preparing a semiconductor substrate of which at least a part of one main surface has a first conductivity type; forming an isolation region for demarcating an element arrangement region corresponding to the part of one main surface of the semiconductor substrate; forming a gate insulating film on a semiconductor surface in the element arrangement region; forming a conductive material layer on the gate insulating film; forming a hard mask material layer above the gate insulating film via the conductive material layer; forming a resist layer on the hard mask material layer by a photolithography process in accordance with a desired gate electrode pattern; performing an etching process using the resist layer as a mask to the hard mask material layer to form a hard mask composed of a part of the hard mask material layer remaining in accordance with the gate electrode pattern; performing an anisotopic etching process using the resist layer as a mask to the conductive material layer to remain a part of the conductive material layer in accordance with the gate electrode pattern; removing the resist layer; performing an isotropic etching process using the hard mask as a mask to decrease a width of a remaining part of the conductive material layer so as to form a gate electrode layer composed of the remaining part of the conductive material layer of which width is decreased; and forming a source and a drain regions having a second conductivity type opposite to the first conductivity type respectively in one and another side of the gate electrode layer by performing an impurity ion doping process using a lamination of the gate insulating film, the gate electrode film and the hard mask and the isolation region as a mask, wherein an ion doping depth in a first part of each of the source and the drain regions under the mask where the hard mask is not overlapped with the gate electrode layer is shallower than an ion doping depth in a second part of each of the source and the drain regions that is not covered by the mask by doping the impurity ions to the first part of each of the source and the drain regions via the mask where the hard mask is not overlapped with the gate electrode layer.

According to the first method of the present invention, the hard mask is formed by patterning the hard mask material layer by the etching process using the resist layer as a mask, and thereafter a part of the conductive layer is remained by patterning the conductive material layer by the anisotropic etching process using the resist layer as a mask. Then, after removing the resist layer, the gate electrode layer is formed by decreasing the width of the remaining part of the conductive layer by the isotropic etching process using the hard mask.

Therefore, the isotropic etching process can be executed precisely by using the hard mask, and the narrow gate electrode layer can be formed precisely.

Moreover, when forming the source and the drain regions by performing an impurity ion doping process using a lamination of the gate insulating film, the gate electrode film and the hard mask and the isolation region as a mask, the ion doping depth in the first part of each of the source and the drain regions under the mask where the hard mask is not overlapped with the gate electrode layer is shallower than the ion doping depth in the second part of each of the source and the drain regions that is not covered by the mask by doping the impurity ions to the first part of each of the source and the drain regions via the mask where the hard mask is not overlapped with the gate electrode layer. Therefore, formation of the source and drain regions and formation of the extension drain structure or LDD structure can be performed simultaneously by one impurity ion doping process, and the whole process can be shortened.

In the above-described first method for manufacturing an insulated-gate type field effect transistor, the hard mask may be formed to have a width narrower than a width of the resist layer by using an isotropic etching process for the etching process.

According to another aspect of the present invention, there is provided a second method for manufacturing an insulated-gate type field effect transistor, comprising the steps of: preparing a semiconductor substrate of which at least a part of one main surface has a first conductivity type; forming an isolation region for demarcating an element arrangement region corresponding to the part of one main surface of the semiconductor substrate; forming a gate insulating film on a semiconductor surface in the element arrangement region; forming a conductive material layer on the gate insulating film; forming a hard mask material layer above the gate insulating film via the conductive material layer; forming a resist layer on the hard mask material layer by a photolithography process in accordance with a desired gate electrode pattern; performing an anisotropic etching process using the resist layer as a mask to the hard mask material layer and the conductive material layer to form a hard mask composed of a part of the hard mask material layer remaining in accordance with the gate electrode pattern and simultaneously to remain a part of the conductive material layer in accordance with the gate electrode pattern; removing the resist layer; performing an isotropic etching process using the hard mask as a mask to decrease a width of a remaining part of the conductive material layer so as to form a gate electrode layer composed of the remaining part of the conductive material layer of which width is decreased; and forming a source and a drain regions having a second conductivity type opposite to the first conductivity type respectively in one and another side of the gate electrode layer by performing an impurity ion doping process using a lamination of the gate insulating film, the gate electrode film and the hard mask and the isolation region as a mask, wherein an ion doping depth in a first part of each of the source and the drain regions under the mask where the hard mask is not overlapped with the gate electrode layer is shallower than an ion doping depth in a second part of each of the source and the drain regions that is not covered by the mask by doping the impurity ions to the first part of each of the source and the drain regions via the mask where the hard mask is not overlapped with the gate electrode layer.

According to the second method of the present invention, the hard mask is formed and the part of the conductive layer is remained in accordance with the gate electrode pattern by patterning the hard mask material layer and the conductive material layer by the anisotropic etching process using the resist layer as a mask. Then, after removing the resist layer, the gate electrode layer is formed by decreasing the width of the remaining part of the conductive layer by the isotropic etching process using the hard mask. Therefore, the isotropic etching process can be executed precisely by using the hard mask, and the narrow gate electrode layer can be formed precisely. Moreover, similar to the first method, formation of the source and drain regions and formation of the extension drain structure or LDD structure can be performed simultaneously by one impurity ion doping process, and the whole process can be shortened.

According to the present invention, miniaturization of a transistor can be realized and an yield can be improved because the narrow gate electrode can be formed precisely. Moreover, formation of the source and drain regions and formation of the extension drain structure or LDD structure can be performed simultaneously by one impurity ion doping process, and the whole process can be shortened. Further, a low energy ion doping apparatus is not necessary.

According to the present invention, a method for manufacturing an insulated-gate type field effect transistor having an extension drain structure or a lightly doped drain (LDD) structure with a small number of processes and a good yield can be provided.

DETAILED DESCRIPTION OF THE PREFERRED EMBODIMENTS

Figure 1:
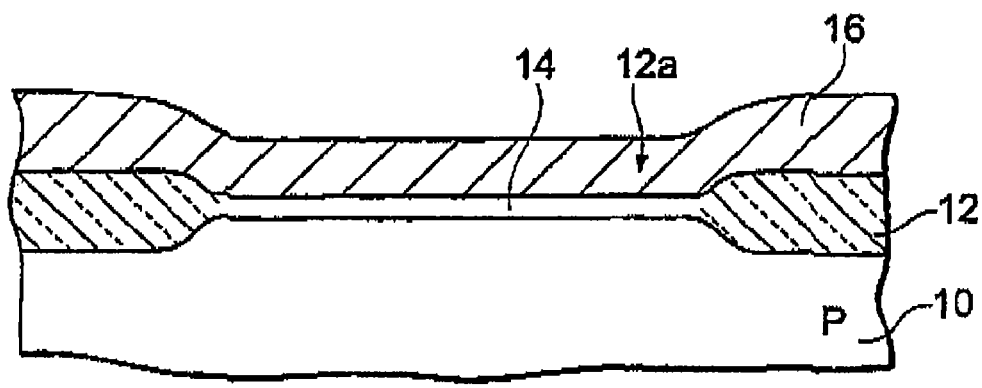
FIG. 1 is a cross sectional view of a substrate showing a poly-silicon deposition process in a method for manufacturing an insulated-gate type field effect transistor according to a first embodiment of the present invention.

FIG. 1 is a cross sectional view of a semiconductor substrate 10 showing a poly-silicon deposition process in a method for manufacturing an insulated-gate type field effect transistor according to a first embodiment of the present invention.

For example, the semiconductor substrate made of silicon has a p-type conductivity type as a whole or a p-type well region. A field insulating film 12 made of silicon oxide is formed on one main surface of the substrate 10 by the well-know selective oxidation technique. The field insulating film 12 demarcate an element hole 12a as an element arranging region corresponding to a part of the substrate 10 having the p-type conductivity or the p-type well region, The field insulating film 12 may be formed by filling an insulating material such as silicon oxide, etc. into a groove formed on the surface of the substrate 10 by using a chemical vapor deposition (CVD) method. Moreover, although the field insulating film is used as an isolation region, for example, an isolation region can be formed by the well-know shallow trench isolation (STI) method or by using an SOI substrate (a substrate formed by depositing a silicon layer on an insulating plate) and oxidizing a part of the silicon layer in advance.

On a surface of the p-type semiconductor in the element hole 12a of the field insulating film 12, a gate insulating film 14 made of silicon oxide is formed by a thermal oxidation process. On the field insulating film 12, a poly-silicon layer 16 is formed with covering the gate insulating film 14 by the CVD method. A conductivity defining impurity is doped to the poly-silicon layer 16 during or after the deposition. It is for making resistance of the poly-silicon layer 16 low enough for using the poly-silicon layer 16 as an electrode or wiring. A thickness of the poly-silicon layer 16 can be 2000 to 6000 Å, preferably 2500 to 4500 Å, and more preferably 3500 Å.

Figure 2:
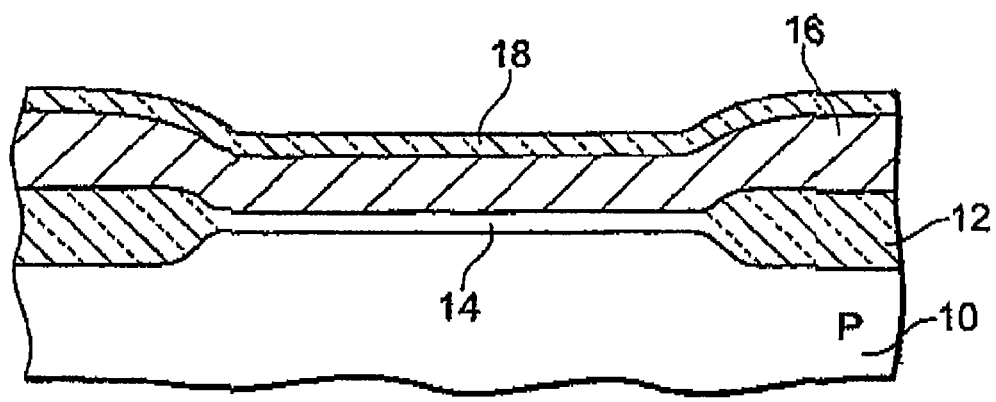
FIG. 2 is a cross sectional view of the substrate showing a poly-silicon oxidation process following the process in FIG. 1.

FIG. 2 is a cross sectional view of the substrate 10 showing a poly-silicon oxidation process following the process in FIG. 1.

On a surface of the poly-silicon layer 16, a silicon oxide layer 18 is formed, for example, by a thermal oxidation process. A thickness of the silicon oxide film 18 can be about 100 to 500 Å.

Figure 3:
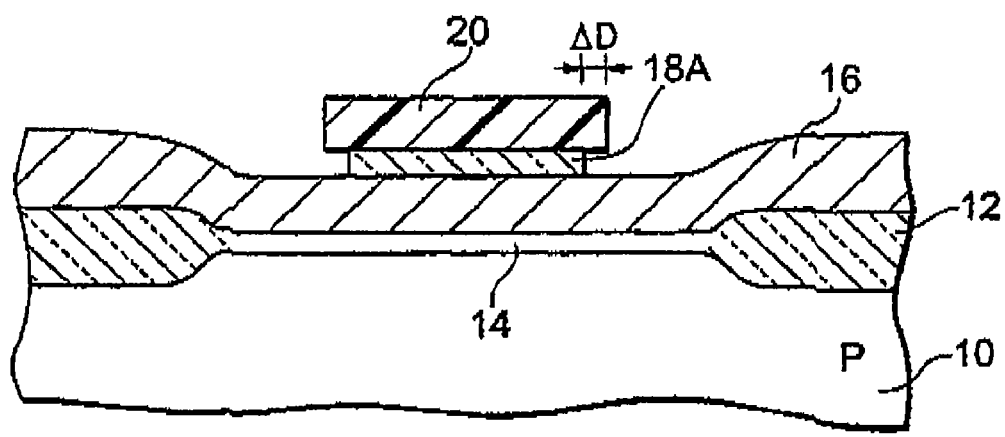
FIG. 3 is a cross sectional view of the substrate showing a resist layer formation process and an isotropic etching process following the process in FIG. 2.

FIG. 3 is a cross sectional view of the substrate showing a resist layer formation process and an isotropic etching process following the process in FIG. 2.

On the silicon oxide layer 18, a resist layer 20 is formed by a photolithography process in accordance with a desired gate electrode pattern. Then, an isotropic etching process using the resist layer 20 as a mask is performed to the silicon oxide layer 18 to remain a part 18A of the silicon oxide layer 18 in accordance with the gate electrode pattern. Each side edge of the remaining part 18A of the silicon oxide layer 18 is retreated from a side edge of the resist layer 20 for about a distance $\Delta D=0.015$ to $0.075$ μm to make a width of the silicon oxide layer 18A narrower than a width of the resist layer 20. The silicon oxide layer 18A will be used as a hard mask in the later-described etching process shown in FIG. 6, and so the silicon oxide layer 18A will be hereinafter called "hard mask".

Figure 4:
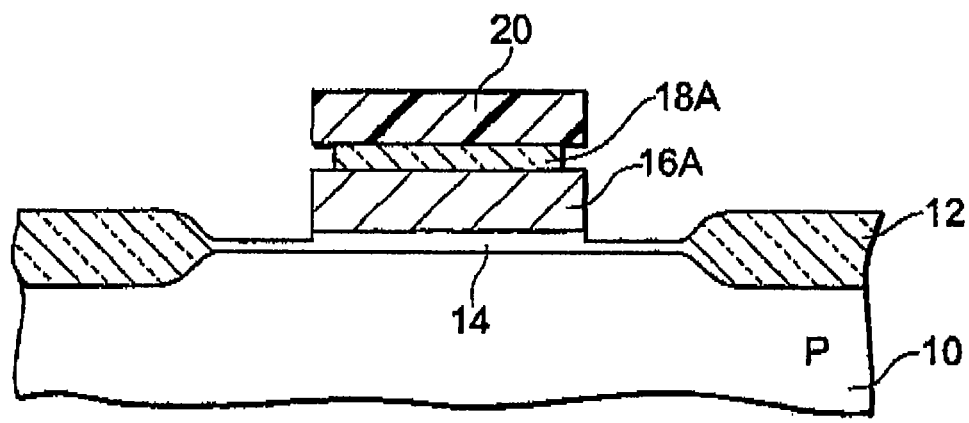
FIG. 4 is a cross sectional view of the substrate showing a dry-etching process following the process in FIG. 3.

FIG. 4 is a cross sectional view of the substrate 10 showing a dry-etching process following the process in FIG. 3.

An anisotropic etching process using the resist layer 20 as a mask is performed to the poly-silicon layer 16 to remain a part 16A of the poly-silicon layer 16 in accordance with the gate electrode pattern. Thicknesses of the field insulating film 12 and the gate insulating film 14 become slightly thin by this etching process.

Figure 5:
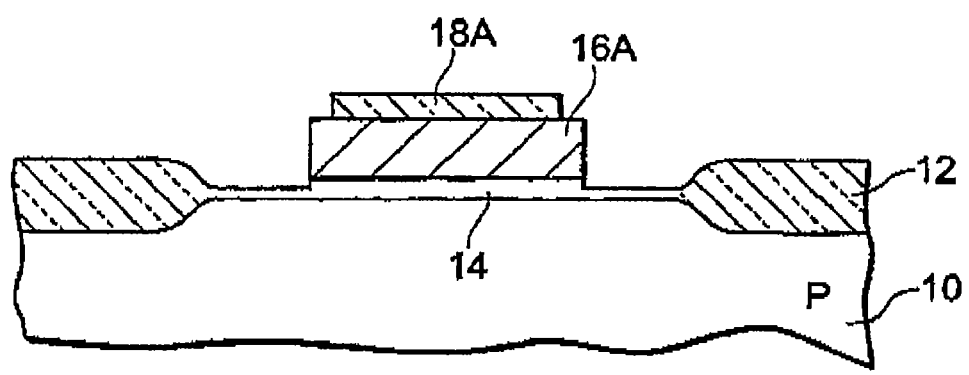
FIG. 5 is a cross sectional view of the substrate showing a resist removing process following the process in FIG. 4.

FIG. 5 is a cross sectional view of the substrate 10 showing a resist removing process following the process in FIG. 4.

The resist layer 20 is removed by an ashing process or the like. As a result, the hard mask 18A is remained on the poly-silicon layer 16A.

Figure 6:
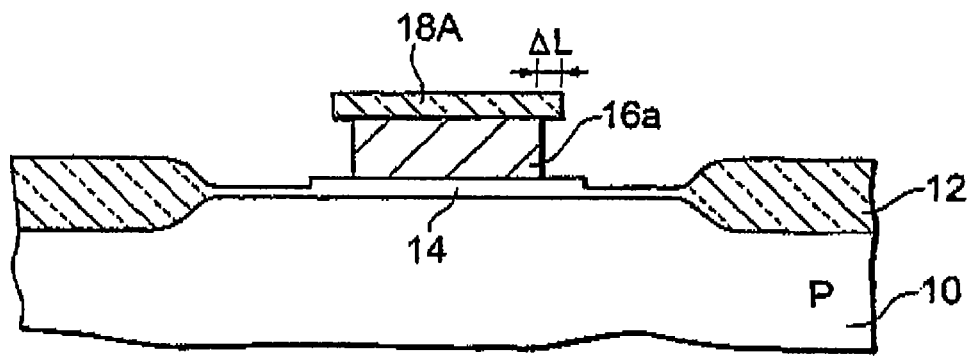
FIG. 6 is a cross sectional view of the substrate showing an isotropic etching process following the process in FIG. 5.

FIG. 6 is a cross sectional view of the substrate 10 showing an isotropic etching process following the process in FIG. 5.

An isotropic etching process using the hard mask 18A is performed to the poly-silicon layer 16A to etch both sides of the poly-silicon layer 16A. That is, each side edge of the poly-silicon layer 16A is retreated from the side edge of the hard mask 18A for about a distance $\Delta L=0.05$ to $0.15$ μm to make a width of the poly-silicon layer 16A narrower than the width of the hard mask 18A so as to form a gate electrode layer 16a composed of a remaining part of the poly-silicon layer 16A.

Figure 7:
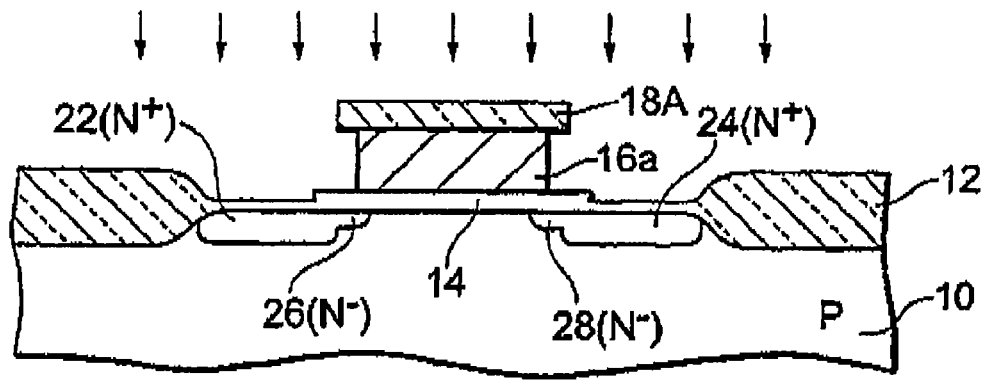
FIG. 7 is a cross sectional view of the substrate showing an ion doping process following the process in FIG. 6.

FIG. 7 is a cross sectional view of the substrate 10 showing an ion doping process following the process in FIG. 6.

An $N^+$-type source region 22 and drain region 24 and an $N^-$-type source region 26 and drain region 28 are simultaneously formed by an impurity ion doping process using a lamination of the gate insulating film 14, the gate electrode layer 16a and the hard mask 18A and the field insulating film 12. In this case, an ion doping depth in a first part of each of the source region 22 and the drain region 24 under the mask where the hard mask 18A is not overlapped with the gate electrode layer 16a is made to be shallower than an ion doping depth in a second part that is not covered by the mask by doping the impurity ions to the first part via the mask where the hard mask 18A is not overlapped with the gate electrode layer 16a to make the $N^-$-type source region 26 and drain region 28 shallower and have lower impurity concentration than the $N^+$-type source region 22 and drain region 24. The impurity ion doping can be performed by doping phosphorus at acceleration voltage of 35 keV and a dose amount of $4\times10^{15}$ $cm^{-2}$.

In the ion doping process shown in FIG. 7, the ion doping is performed via the gate insulating film 14; therefore, a channeling effect phenomenon is restrained, and variations in the depths of the source and drain regions are reduced. Moreover, the $N^-$-type source region 26 and drain region 28 are formed by diverting the formation process of the $N^+$-type source region 22 and drain region 24; therefore, a low energy ion doping apparatus is not necessary.

Figure 8:
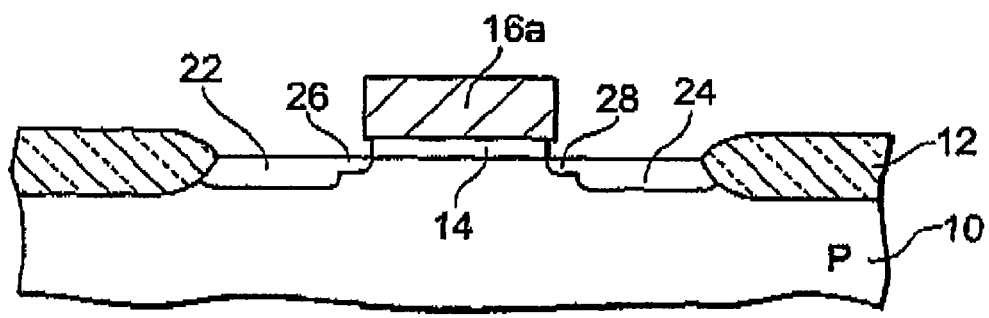
FIG. 8 is a cross sectional view of the substrate showing an isotropic etching process following the process in FIG. 7.

FIG. 8 is a cross sectional view of the substrate 10 showing an isotropic etching process following the process in FIG. 7.

An exposing part of the gate insulating film 14 and the hard mask 18A are removed by an isotropic etching process. As a result, an upper surface of the gate electrode layer 16a is exposed, and the $N^+$-type source region 22 and drain region 24 and the $N^-$-type source region 26 and drain region 28 are exposed.

Figure 9:
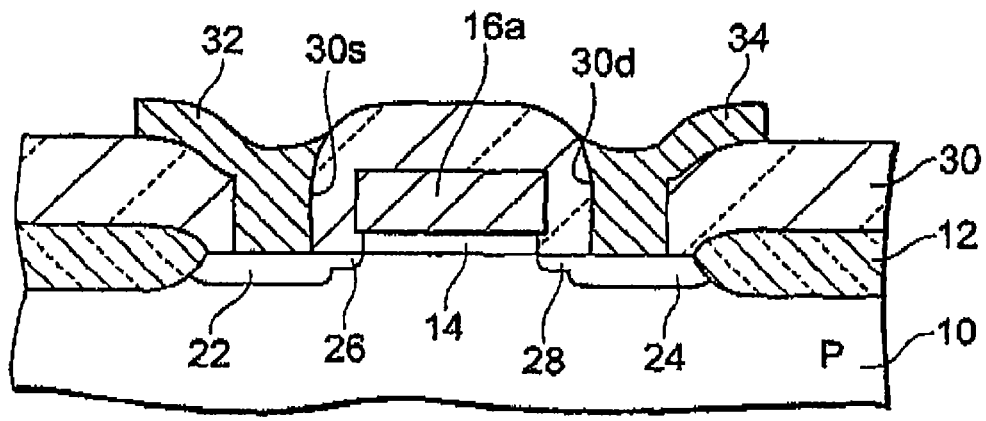
FIG. 9 is a cross sectional view of the substrate showing an interlayer insulating film formation process and a wiring formation process following the process in FIG. 8.

FIG. 9 is a cross sectional view of the substrate 10 showing an interlayer insulating film formation process and a wiring formation process following the process in FIG. 8.

An interlayer insulating layer 30 made of silicon oxide, etc. on the upper surface of the substrate 10 by one or a combination of the CVD method and an application method. Thereafter, connecting holes 30s and 30d respectively corresponding to the source region 22 and the drain region 24 are formed by performing a photolithography process and a dry-etching process to the insulating film 30. Then, by coating and patterning a wiring material layer made of Al or Al alloy, etc. over the upper surface of the substrate 10, a source wiring layer 32 and a drain wiring layer 34 are formed. The wiring layers 32 and 34 are connected respectively to the source and drain regions 22 and 24 via the connecting holes 30s and 30d.

According to the first embodiment of the present invention, the hard mask 18A is side-etched at the isotropic etching process shown in FIG. 3, and the poly-silicon layer 16A is side-etched at the isotopic etching process shown in FIG. 6; therefore, the narrow gate electrode layer 16a can be formed precisely, miniaturization of a transistor will be possible, and manufacturing yield will be improved. Moreover, at the ion doping process shown in FIG. 7, the $N^+$-type deep source region 22 and drain region 24 and the $N^-$-type shallow source region 26 and drain region 28 are simultaneously formed; therefore, a manufacturing cost will be reduced by shortening the manufacturing processes.

Next, a second embodiment of the present invention will be described with reference to FIG. 10 to FIG. 16. In the drawings, the components similar to those in the first embodiment are labeled with the same reference numbers and symbols as in the first embodiment, and the explanations for those similar components will be omitted.

Figure 10:
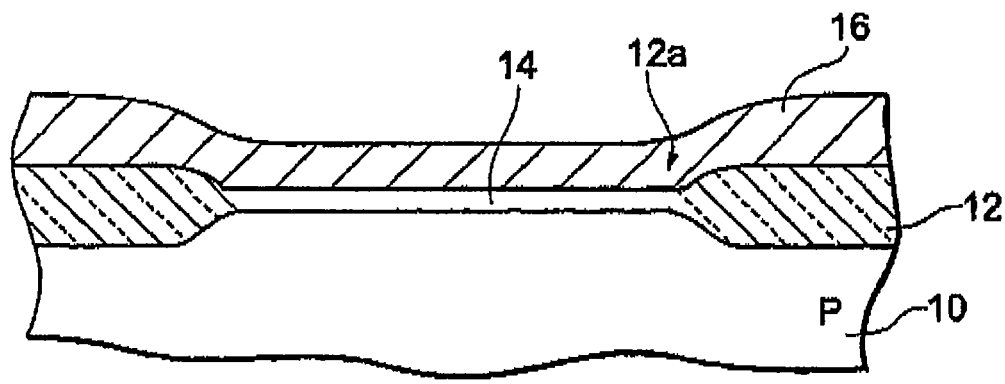
FIG. 10 is a cross sectional view of a substrate showing a poly-silicon deposition process in a method for manufacturing an insulated-gate type field effect transistor according to a second embodiment of the present invention.

FIG. 10 is a cross sectional view of a substrate 10 showing a poly-silicon deposition process in a method for manufacturing an insulated-gate type field effect transistor according to the second embodiment of the present invention.

On the field insulating film 12 covering the surface of the semiconductor substrate 10, the poly-silicon layer 16 is deposited with covering the gate insulating film 14 by the CVD method. The poly-silicon layer 16 has a thickness of 500 to 5000 Å (preferably 800 to 2500 Å, and more preferably 1500 Å).

Figure 11:
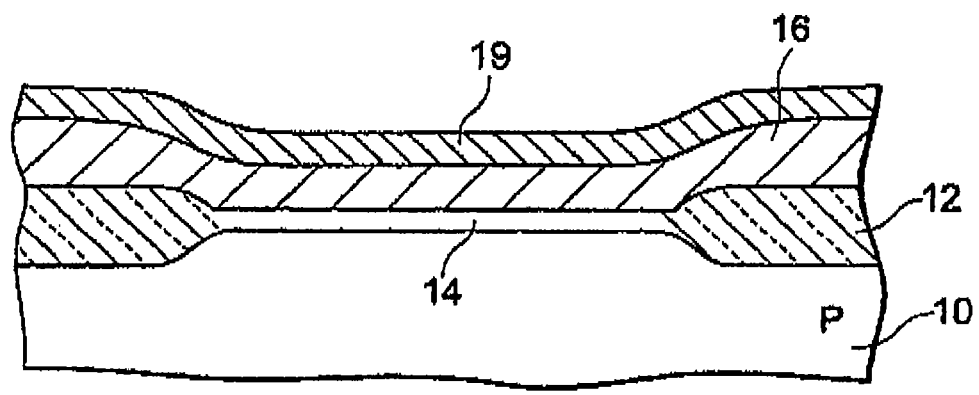
FIG. 11 is a cross sectional view of the substrate showing a WSi deposition process following the process in FIG. 10.

FIG. 11 is a cross sectional view of the substrate 10 showing a WSi deposition process following the process in FIG. 10.

A tungsten silicide (hereinafter called "WSi") layer 19 is deposited on the poly-silicon layer 16 by sputtering or the like. The WSi layer 19 has a thickness of 500 to 5000 Å (preferably 1000 to 3000 Å, and more preferably 2000 Å).

Figure 12:
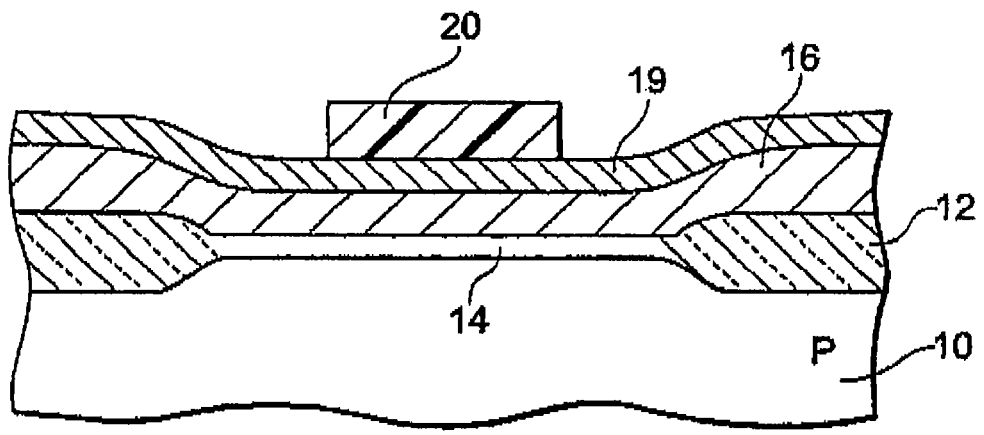
FIG. 12 is a cross sectional view of the substrate showing a resist layer formation process and an isotropic etching process following the process in FIG. 11.

FIG. 12 is a cross sectional view of the substrate 10 showing a resist layer formation process and an isotropic etching process following the process in FIG. 11.

The resist layer 20 is formed on the WSi layer 19 by the photolithography process in accordance with a desired gate electrode pattern.

Figure 13:
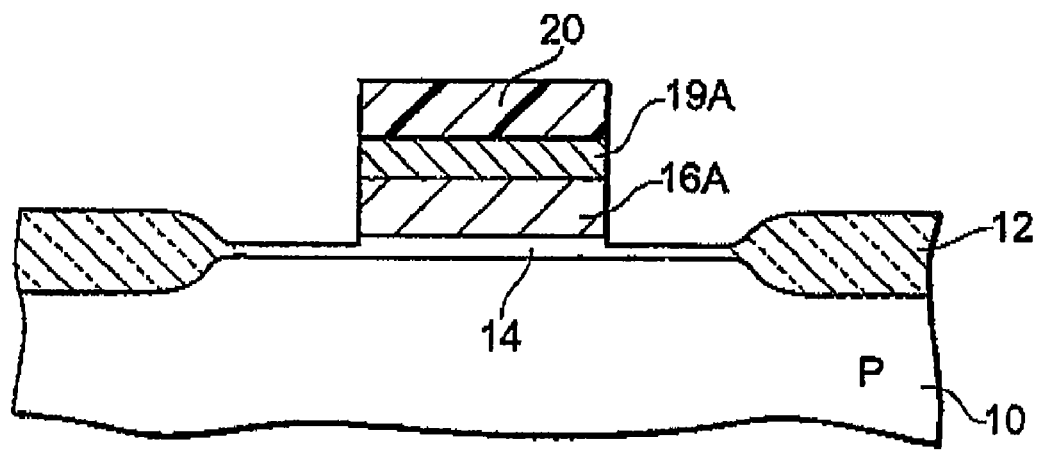
FIG. 13 is a cross sectional view of the substrate showing a dry-etching process following the process in FIG. 12.

FIG. 13 is a cross sectional view of the substrate 10 showing a dry-etching process following the process in FIG. 12.

An anisotropic etching using the resist layer 20 as a mask is performed to the WSi layer 19 and the poly-silicon layer 16 to remain a part 19A of the WSi layer 19 and a part 16A of the poly-silicon layer 16 in accordance with the gate electrode pattern. Thicknesses of the field insulating film 12 and the gate insulating film 14 become slightly thin by this etching process.

Figure 14:
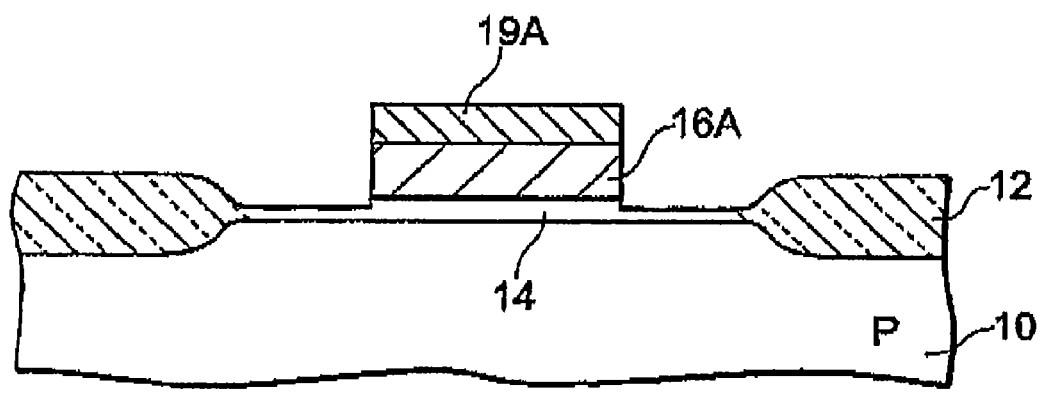
FIG. 14 is a cross sectional view of the substrate showing a resist removing process following the process in FIG. 13.

FIG. 14 is a cross sectional view of the substrate 10 showing a resist removing process following the process in FIG. 13.

The resist layer 20 is removed by the ashing process or the like. As a result, an upper surface of the WSi layer 19A is exposed. The WSi layer 19A will be used as a hard mask in the later-described etching process shown in FIG. 15, and so the WSi layer 19A will also be hereinafter called "hard mask".

Figure 15:
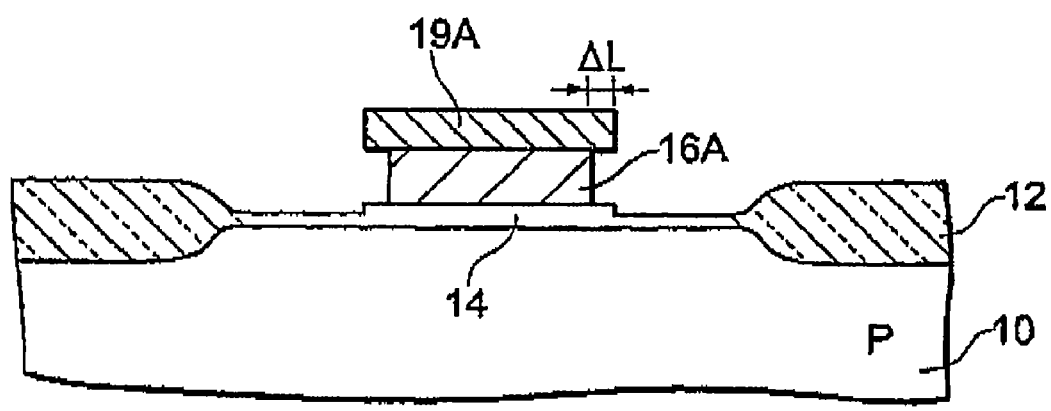
FIG. 15 is a cross sectional view of the substrate showing an isotropic etching process following the process in FIG. 14.

FIG. 15 is a cross sectional view of the substrate 10 showing an isotropic etching process following the process in FIG. 14.

An isotropic etching process using the hard mask 19A is performed to the poly-silicon layer 16A to etch both sides of the poly-silicon layer 16A. That is, each side edge of the poly-silicon layer 16A is retreated from the side edge of the hard mask 19A for a predetermined distance ΔL to make a width of the poly-silicon layer 16A narrower than the width of the hard mask 19A so as to form a gate electrode layer 16a composed of a remaining part of the poly-silicon layer 16A.

Figure 16:
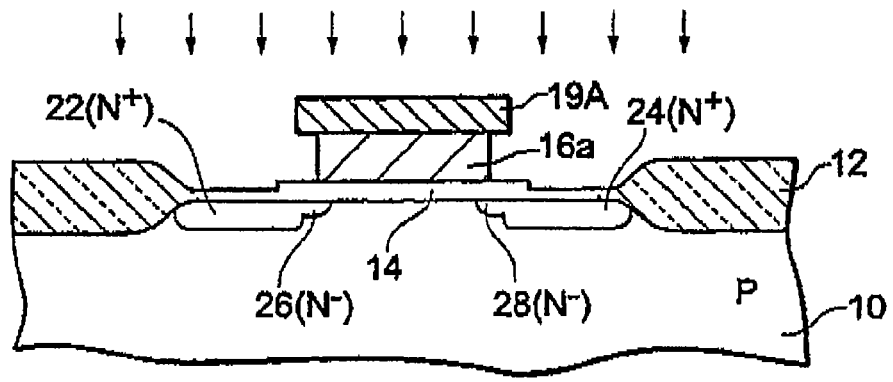
FIG. 16 is a cross sectional view of the substrate showing an ion doping process following the process in FIG. 15.
Figure 17:
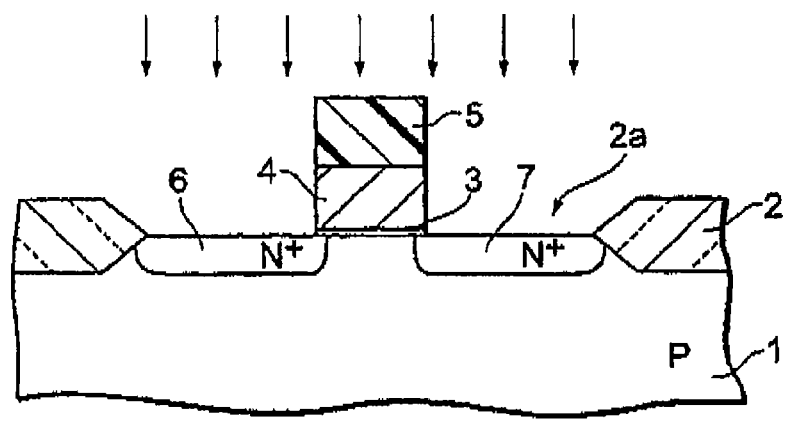
FIG. 17 is a cross sectional view of a substrate showing a first ion doping process in a method for manufacturing an insulated-gate type field effect transistor having an LDD structure according to a prior art.
Figure 18:
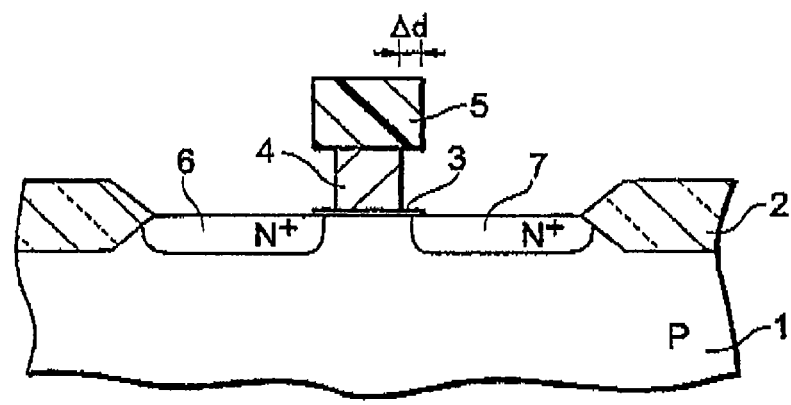
FIG. 18 is a cross sectional view of the substrate showing an isotropic etching process following the process in FIG. 17.
Figure 19:
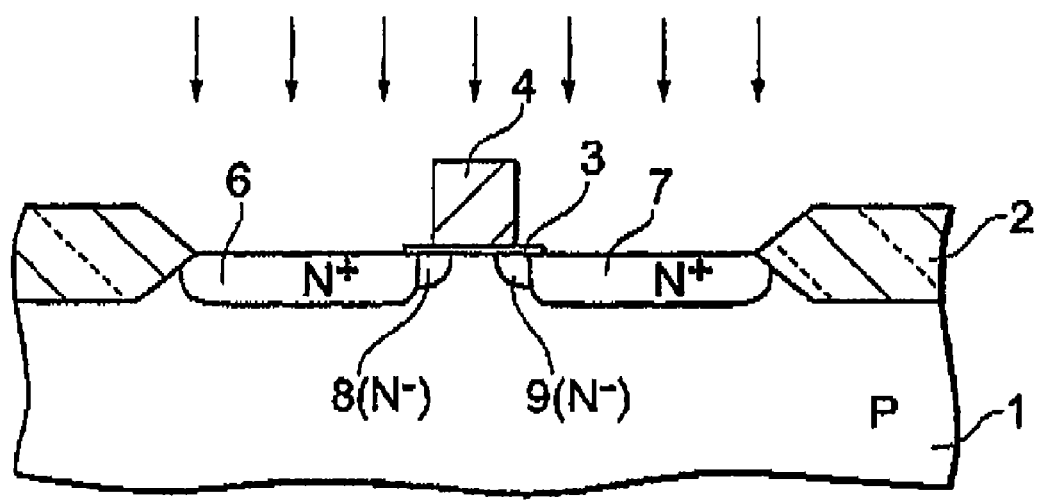
FIG. 19 is a cross sectional view of the substrate showing a resist removing process and a second ion doping process following the process in FIG. 18.

FIG. 16 is a cross sectional view of the substrate 10 showing an ion doping process following the process in FIG. 15.

The $N^+$-type source region 22 and drain region 24 and the $N^-$-type source region 26 and drain region 28 are simultaneously formed by an impurity ion doping process using a lamination of the gate insulating film 14, the gate electrode layer 16a and the hard mask 19A and the field insulating film 12. In this case, an ion doping depth in a first part of each of the source region 22 and the drain region 24 under the mask where the hard mask 19A is not overlapped with the gate electrode layer 16a is made to be shallower than an ion doping depth in a second part that is not covered by the mask by doping the impurity ions to the first part via the mask where the hard mask 19A is not overlapped with the gate electrode layer 16a to make the $N^-$-type source region 26 and drain region 28 shallower and have lower impurity concentration than the $N^+$-type source region 22 and drain region 24. The impurity ion doping can be performed by doping phosphorus at acceleration voltage of 100 keV and a dose amount of $3 \times 10^{15}$ cm$^{-2}$.

In the ion doping process shown in FIG. 16, the ion doping is performed via the gate insulating film 14; therefore, a channeling effect phenomenon is restrained, and variations in the depths of the source and drain regions are reduced. Moreover, the $N^-$-type source region 26 and drain region 28 are formed by diverting the formation process of the $N^+$-type source region 22 and drain region 24; therefore, a low energy ion doping apparatus is not necessary.

After the ion doping process shown in FIG. 16, as described with reference to FIG. 8, the exposing part of the gate insulating film 14 is removed, and the source region 22 and 26 and the drain region 24 and 28 are exposed. Thereafter, as described with reference to FIG. 9, formation of the interlayer insulating layer and formation of the source and drain wirings are sequentially performed. In this case, the hard mask (WSi layer) 19A is remained on the gate electrode layer (poly-silicon layer) 16a to compose the so-called "polycide gate".

According to the second embodiment of the present invention, the poly-silicon layer 16A is side-etched at the isotropic etching process shown in FIG. 15; therefore, the narrow gate electrode layer 16a can be formed precisely, miniaturization of a transistor will be possible, and manufacturing yield will be improved. Moreover, at the ion doping process shown in FIG. 16, the $N^+$-type deep source region 22 and drain region 24 and the $N^-$-type shallow source region 26 and drain region 28 are simultaneously formed; therefore, a manufacturing cost will be reduced by shortening the manufacturing processes. Further, the WSi layer 19 and the poly-silicon layer 16 are patterned together in the process shown in FIG. 13; therefore, the number of the etching process can be reduced by one comparing to the first embodiment of the present invention, and a manufacturing cost will be reduced by shortening the manufacturing processes.

The present invention has been described in connection with the preferred embodiments. The invention is not limited only to the above embodiments. It is apparent that various modifications, improvements, combinations, and the like can be made by those skilled in the art. For example, following modifications are possible.

Material for the hard mask is not limited to the silicon oxide by the thermal oxidation or the tungsten silicide but also silicon oxide by the CVD method can be used or material such as silicon nitride, silicon oxynitride, alumina, TiOx, TiN, high meting point metal such as Mo, W and Ti, molybdenum silicide, titan silicide, etc. can be used.

Material for the gate electrode is not limited to the poly-silicon but also one of material selected from a material group of high meting point metal such as Mo, W and Ti, and metal silicide of those or a lamination of that one of material and poly-silicon can be used.

Although the above-described embodiments have been explained mainly on the N-channel type insulated-gate type field effect transistor, a P-channel type insulated-gate type field effect transistor can be manufactured by reversing the conductivity type.

Although the hard mask 18A is removed in the process shown in FIG. 8 in the first embodiment, the hard mask 18A may be remained to use as a part of the interlayer insulating film 30. Moreover, when the hard mask 18A is formed of conductive material, the hard mask 18A may be remained as a part of the gate electrode shown in FIG. 7. Further, the hard mask 19A may be formed of insulating material. In this case, the hard mask 19A may be removed after the process shown in FIG. 16 or may be remained.

Although the shallow source and drain regions are formed as an $N^-$-type in the above-described embodiments, the shallow source and drain regions may be $N^+$-type or arbitrary modified as far as they can compose the extension drain structure.

What is claimed is:

1. A method for manufacturing an insulated-gate type field effect transistor, comprising the steps of:
    preparing a semiconductor substrate of which at least a part of one main surface has a first conductivity type;
    forming an isolation region for demarcating an element arrangement region corresponding to the part of one main surface of the semiconductor substrate;
    forming a gate insulating film on a semiconductor surface in the element arrangement region;
    forming a conductive material layer on the gate insulating film;
    forming a hard mask material layer above the gate insulating film via the conductive material layer;
    forming a resist layer on the hard mask material layer by a photolithography process in accordance with a desired gate electrode pattern;
    performing an etching process using the resist layer as a mask to the hard mask material layer to form a hard mask composed of a part of the hard mask material layer remaining in accordance with the gate electrode pattern;
    performing an anisotropic etching process using the resist layer as a mask to the conductive material layer to remain a part of the conductive material layer in accordance with the gate electrode pattern;
    removing the resist layer;
    performing an isotropic etching process using the hard mask as a mask to decrease a width of a remaining part of the conductive material layer so as to form a gate electrode layer composed of the remaining part of the conductive material layer of which width is decreased; and
    forming a source and a drain regions having a second conductivity type opposite to the first conductivity type respectively in one and another side of the gate electrode layer by performing an impurity ion doping process using a lamination of the gate insulating film, the gate electrode film and the hard mask and the isolation region as a mask, wherein an ion doping depth in a first part of each of the source and the drain regions under the mask where the hard mask is not overlapped with the gate electrode layer is shallower than an ion doping depth in a second part of each of the source and the drain regions that is not covered by the mask by doping the impurity ions to the first part of each of the source and the drain regions via the mask where the hard mask is not overlapped with the gate electrode layer.

2. The method for manufacturing an insulated-gate type field effect transistor according to claim 1, wherein the hard mask is formed to have a width narrower than a width of the resist layer by using an isotropic etching process for the etching process.

3. A method for manufacturing an insulated-gate type field effect transistor, comprising the steps of:
    preparing a semiconductor substrate of which at least a part of one main surface has a first conductivity type;
    forming an isolation region for demarcating an element arrangement region corresponding to the part of one main surface of the semiconductor substrate;
    forming a gate insulating film on a semiconductor surface in the element arrangement region;
    forming a conductive material layer on the gate insulating film;
    forming a hard mask material layer above the gate insulating film via the conductive material layer;
    forming a resist layer on the hard mask material layer by a photolithography process in accordance with a desired gate electrode pattern;
    performing an anisotropic etching process using the resist layer as a mask to the hard mask material layer and the conductive material layer to form a hard mask composed of a part of the hard mask material layer remaining in accordance with the gate electrode pattern and simultaneously to remain a part of the conductive material layer in accordance with the gate electrode pattern;
    removing the resist layer;
    performing an isotropic etching process using the hard mask as a mask to decrease a width of a remaining part of the conductive material layer so as to form a gate electrode layer composed of the remaining part of the conductive material layer of which width is decreased; and
    forming a source and a drain regions having a second conductivity type opposite to the first conductivity type respectively in one and another side of the gate electrode layer by performing an impurity ion doping process using a lamination of the gate insulating film, the gate electrode film and the hard mask and the isolation region as a mask, wherein an ion doping depth in a first part of each of the source and the drain regions under the mask where the hard mask is not overlapped with the gate electrode layer is shallower than an ion doping depth in a second part of each of the source and the drain regions that is not covered by the mask by doping the impurity ions to the first part of each of the source and the drain regions via the mask where the hard mask is not overlapped with the gate electrode layer.

* * * * *